United States Patent
Kim et al.

(10) Patent No.: US 6,813,204 B2
(45) Date of Patent: Nov. 2, 2004

(54) SEMICONDUCTOR MEMORY DEVICE COMPRISING CIRCUIT FOR PRECHARGING DATA LINE

(75) Inventors: Chul-soo Kim, Suwon (KR); Young-hyun Jun, Seoul (KR); Jae-goo Lee, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 10/324,406

(22) Filed: Dec. 20, 2002

(65) Prior Publication Data

US 2004/0032776 A1 Feb. 19, 2004

(30) Foreign Application Priority Data

Aug. 13, 2002 (KR) .................................. 10-2002-47901

(51) Int. Cl.[7] ................................................ G11C 7/00
(52) U.S. Cl. .................. 365/203; 365/205; 365/230.06
(58) Field of Search ................................ 365/203, 205, 365/208, 230.06

(56) References Cited

U.S. PATENT DOCUMENTS

| | | | | |
|---|---|---|---|---|
| 5,416,371 A | * | 5/1995 | Katayama et al. | ............. 327/57 |
| 6,185,151 B1 | * | 2/2001 | Cho | ........................... 365/233 |
| 6,487,132 B2 | * | 11/2002 | Bae et al. | .................... 365/203 |

* cited by examiner

*Primary Examiner*—Gene N. Auduong
(74) *Attorney, Agent, or Firm*—F. Chau & Associates LLC

(57) ABSTRACT

A semiconductor memory device having a circuit precharging a data line comprises a first precharge circuit, which precharges a first data line pair to a first voltage level in a precharge operation state, and a second precharge circuit, which precharges a second data line pair to a second voltage level in a precharge operation state. The semiconductor memory device comprises a data input driver, which receives data and drives the data to the first data line pair, a switch, which in response to a selection signal, connects or disconnects the first data line pair with the second data line pair, and a charge-sharing control circuit, which in response to the selection signal makes one line of the first data line pair and one line of the second data line pair share charge. The semiconductor memory device reduces current consumption over repeated write/precharge operations.

12 Claims, 4 Drawing Sheets

FIG. 2

| STATE | DATA1 | /DATA1 | DATA2 | /DATA2 |
|---|---|---|---|---|
| PRECHARGE | HIGH | HIGH | HIGH | HIGH |
| WRITE DRIVE | HIGH | LOW | HIGH | LOW |
| PRECHARGE | HIGH | HIGH | HIGH | HIGH |

FIG. 4
| STATE | DATA1 | /DATA1 | DATA2 | /DATA2 |
|---|---|---|---|---|
| PRECHARGE | LOW | LOW | HIGH | HIGH |
| WRITE DRIVE | HIGH (LOW) | LOW (HIGH) | HIGH (LOW) | LOW (HIGH) |
| CHARGE RECYCLING | 0.5HIGH (LOW) | LOW (0.5HIGH) | HIGH (0.5HIGH) | 0.5HIGH (HIGH) |
| PRECHARGE | LOW | LOW | HIGH | HIGH |
FIG. 5
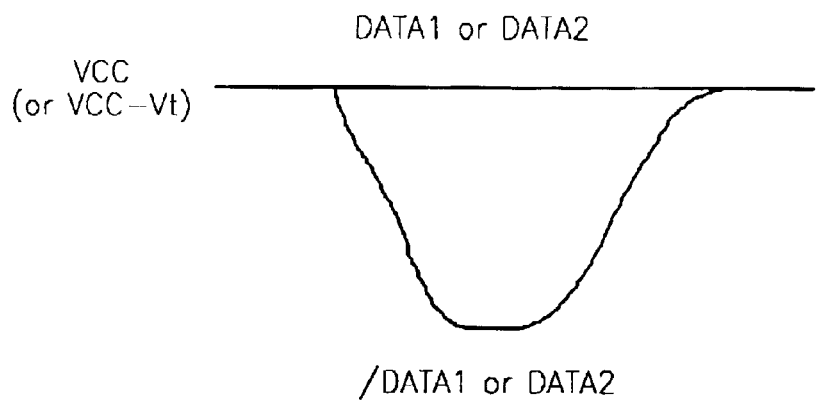
FIG. 6
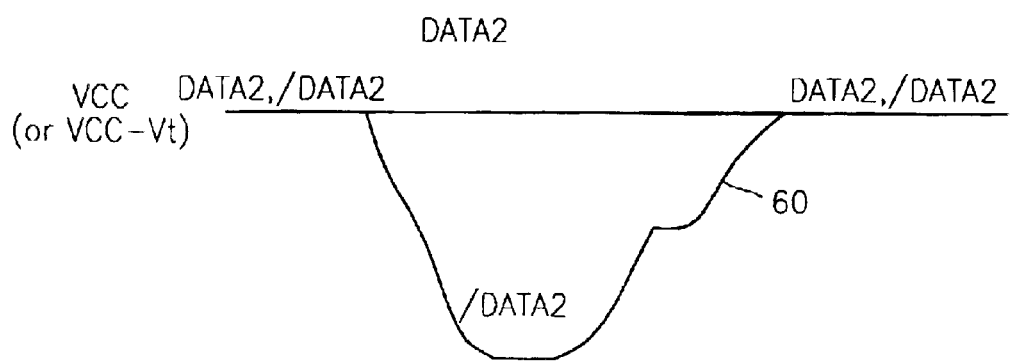

SEMICONDUCTOR MEMORY DEVICE COMPRISING CIRCUIT FOR PRECHARGING DATA LINE

BACKGROUND OF THE INVENTION

1. Field of the Invention

The present invention relates to a semiconductor memory device, and more particularly, to a semiconductor memory device having reduced electric current consumption wherein a data line pair share an electric charge during a data write operation.

2. Description of the Related Art

Generally, a semiconductor memory device needs a circuit for precharging a data line to a predetermined voltage level before performing an operation for writing external data.

FIG. 1 is a diagram of a semiconductor memory device 100 having a prior art precharge circuit, and FIG. 2 is a table showing voltage levels of data line pairs according to the operation of the semiconductor memory device 100. The voltage level corresponding to a "high" logic level, shown in FIG. 2, is the difference (Vcc−Vt) of a voltage supply (Vcc) and a transistor threshold voltage (Vt).

The semiconductor memory device 100 comprises a data input driver 110, a first data line pair charge circuit 120, a switching circuit 130, and a second data line pair charge circuit 140. Data outputs from the second data line pair (DATA2,/DATA2) are input to a memory array (not shown).

The data input driver 110 is connected to the first data line pair (DATA1, /DATA1). The data input driver 110 drives the first data line pair (DATA1, /DATA1) after receiving predetermined data from a data input terminal (DATA_IN).

The first data line pair charge circuit 120, in response to a control signal (DP1), precharges the first data line pair (DATA1, /DATA1) to a predetermined voltage level. The second data line pair charge circuit 140, in response to a control signal (DP2), precharges the second data line pair (DATA2, /DATA2) to a predetermined voltage level.

The switching circuit 130, in response to a selection signal (SEL), connects the first data line pair (DATA1,/DATA1) with the second data line pair (DATA2, /DATA2).

While precharging a data line, predetermined control signals (DP1, DP2) are transited to a "low" logic level (ground (VSS) level), and both the first data line pair (DATA1, /DATA1) and the second data line pair (DATA2, /DATA2) are precharged to a "high" logic level in response to predetermined control signal (DP1, DP2). The "high" logic level is the level of the voltage supply (Vcc) or voltage supply−threshold voltage (Vcc−Vt).

When a data write operation is performed, DATA1 is in a "high" logic level while /DATA1 is transited to a "low" logic level, or DATA1 is transited to a "low" logic level while /DATA is in a "high" logic level in the first data line pair (DATA1, /DATA1) according to data driven by the data input driver 110. By the operation of the switching circuit 130, the second data line pair (DATA2, /DATA2) are transited to substantially the same voltage levels as the first data line pair (DATA1, /DATA1).

After finishing the data write operation, the semiconductor memory device 100 returns to the precharge state. In this case, both the first data line pair (DATA1, /DATA1) and the second data line pair (DATA2, /DATA2) are precharged to the voltage supply (Vcc), as described above.

At this time, one line of the first data line pair (DATA1, /DATA1) and one line of the second data line pair (DATA2, /DATA2) can be transited to a "low" logic state by a write operation from a "high" logic state by the precharge operation, and can be transited to a "high" logic level again by a precharge operation. Therefore, these lines consume electric current as write operations and precharge operations are repeated.

Therefore, a need exists for a semiconductor memory device having reduced electric current consumption wherein a data line pair share an electric charge during a data write operation.

SUMMARY OF THE INVENTION

According to an embodiment of the present invention, a semiconductor memory device exhibits reduced electric current consumption over repeated write/precharge operations.

According to an embodiment of the present invention, a semiconductor memory device comprises a precharge circuit that precharges a first data line pair and a second line pair to respective predetermined voltage levels in a precharge operation state. The semiconductor memory device comprises a data input driver, which receives data and drives the data to the first data line pair, and a control circuit, which in response to a selection signal, connects or disconnects the first data line pair with the second data line pair, and in response to the selection signal, connects or disconnects one line of the first data line pair to one of the second data line pair.

It is preferable that the precharge circuit comprises a first precharge circuit, which in response to a first control signal, precharges the first data line pair to a first voltage level, and a second precharge circuit, which in response to a second control signal, precharges the second data line pair to a second voltage level.

It is preferable that the first voltage level is different from the second voltage level.

It is preferable that the control circuit controls, in response to the selection signal, the voltage level of one line of the first data line pair and the voltage level of one line of the second data line pair change to a predetermined voltage level between the first voltage level and the second voltage level.

The control circuit comprises a first NOR gate for receiving a first line of the second data line pair and the selection signal and outputting a first logic signal, and a second NOR gate for receiving a second line of the second data line pair and the selection signal and outputting a second logic signal. The control circuit further comprises an NMOS transistor comprising a gate for receiving the first logic signal, a source coupled to the first line of the second data line pair and a drain coupled to a second line of the first data line pair, and an NMOS transistor comprising a gate for receiving the second logic signal, a source coupled to the second line of the second data line pair and a drain coupled to a first line of the first data line pair.

According to another embodiment of the present invention, a semiconductor memory device comprises a first precharge circuit, which precharges a first data line pair to a first voltage level in a precharge operation state, and a second precharge circuit, which precharges a second data line pair to a second voltage level in a precharge operation state. The semiconductor memory device further comprises a data input driver, which receives data and drives the data to the first data line pair, a switch, which in response to a selection signal, connects or disconnects the first data line pair with the second data line pair, and a charge-sharing control circuit, which in response to the selection signal, makes one line of the first data line pair and one line of the second data line pair share charge.

It is preferable that the first voltage level is different from the second voltage level.

It is preferable that the charge-sharing control circuit controls, in response to the selection signal, the voltage level of one line of the first data line pair and the voltage level of one line of the second data line pair change to a predetermined voltage level between the first voltage level and the second voltage level.

According to another embodiment of the present invention, a semiconductor memory device comprises a first data line pair, a second data line pair, and a data input driver, which is connected to the first data line pair and drives input data to the first data line pair. The semiconductor memory device further comprises a charge-sharing control circuit, which is connected between the first data line pair and the second data line pair, and in a first step of a precharge operation, connects one line of the first data line pair and one line of the second data line pair.

It is preferable that the first data line pair is precharged to a first voltage level in a second step of the precharge operation, the second data line pair is precharged to a second voltage level in the second step of the precharge operation, and the voltage level of one line of the first data line pair and one line of the second data line pair, which are connected to each other in the first step of the precharge operation, are at a predetermined voltage level between the first voltage level and the second voltage level.

BRIEF DESCRIPTION OF THE DRAWINGS

The above object and advantages of the present invention will become more apparent by describing in detail preferred embodiments thereof with reference to the attached drawings in which:

FIG. 2 is a table showing voltage levels of data line pairs according to the operation of the semiconductor memory device shown in FIG. 1;

FIG. 4 is a table showing voltage levels of data line pairs according to the operation of the semiconductor memory device shown in FIG. 3;

FIG. 5 is a graph showing the operation of data lines in a prior art semiconductor memory device; and FIG. 6 is a graph showing the operation of data lines in a semiconductor memory device according to an embodiment of the present invention.

DESCRIPTION OF THE PREFERRED EMBODIMENTS

Figure 1:
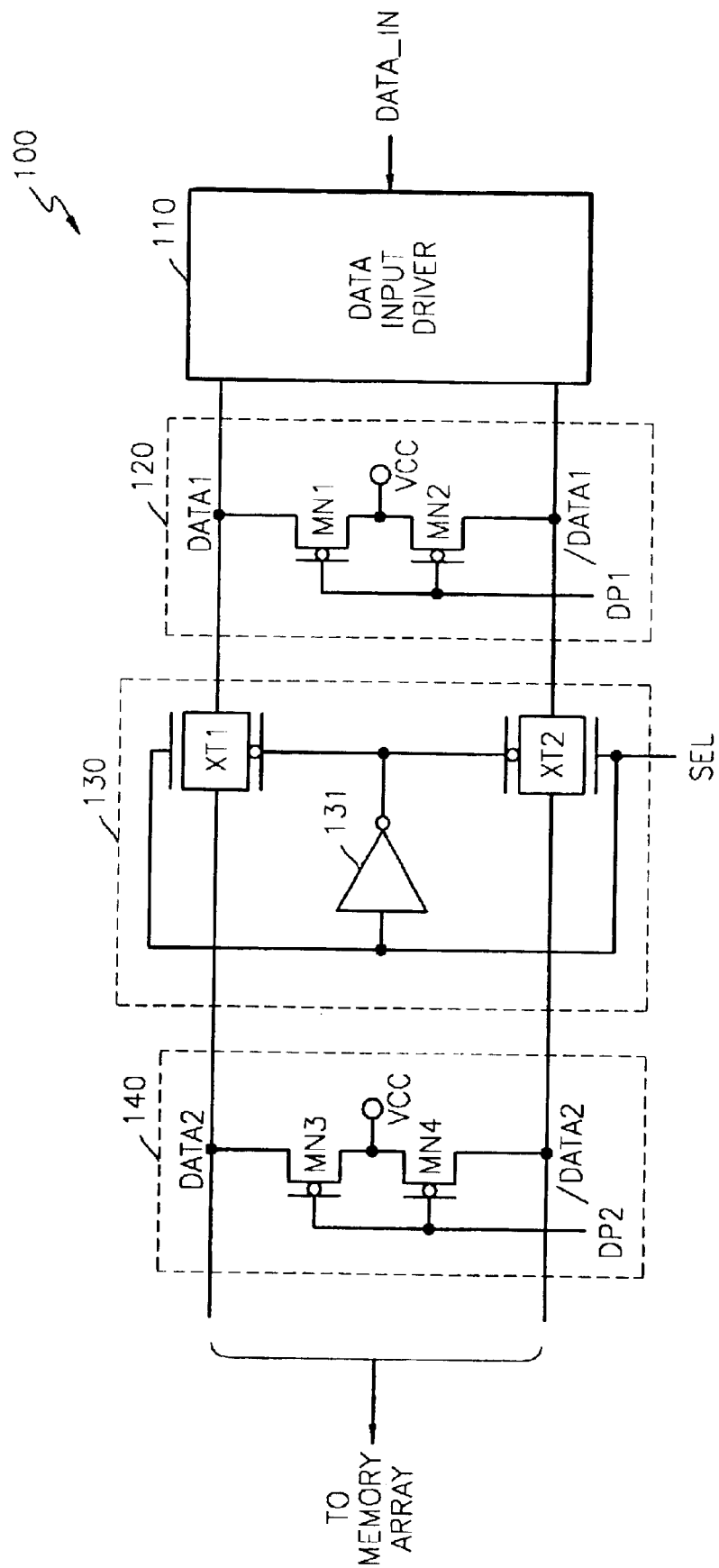
FIG. 1 is a diagram of a semiconductor memory device having a prior art precharge circuit.
Figure 3:
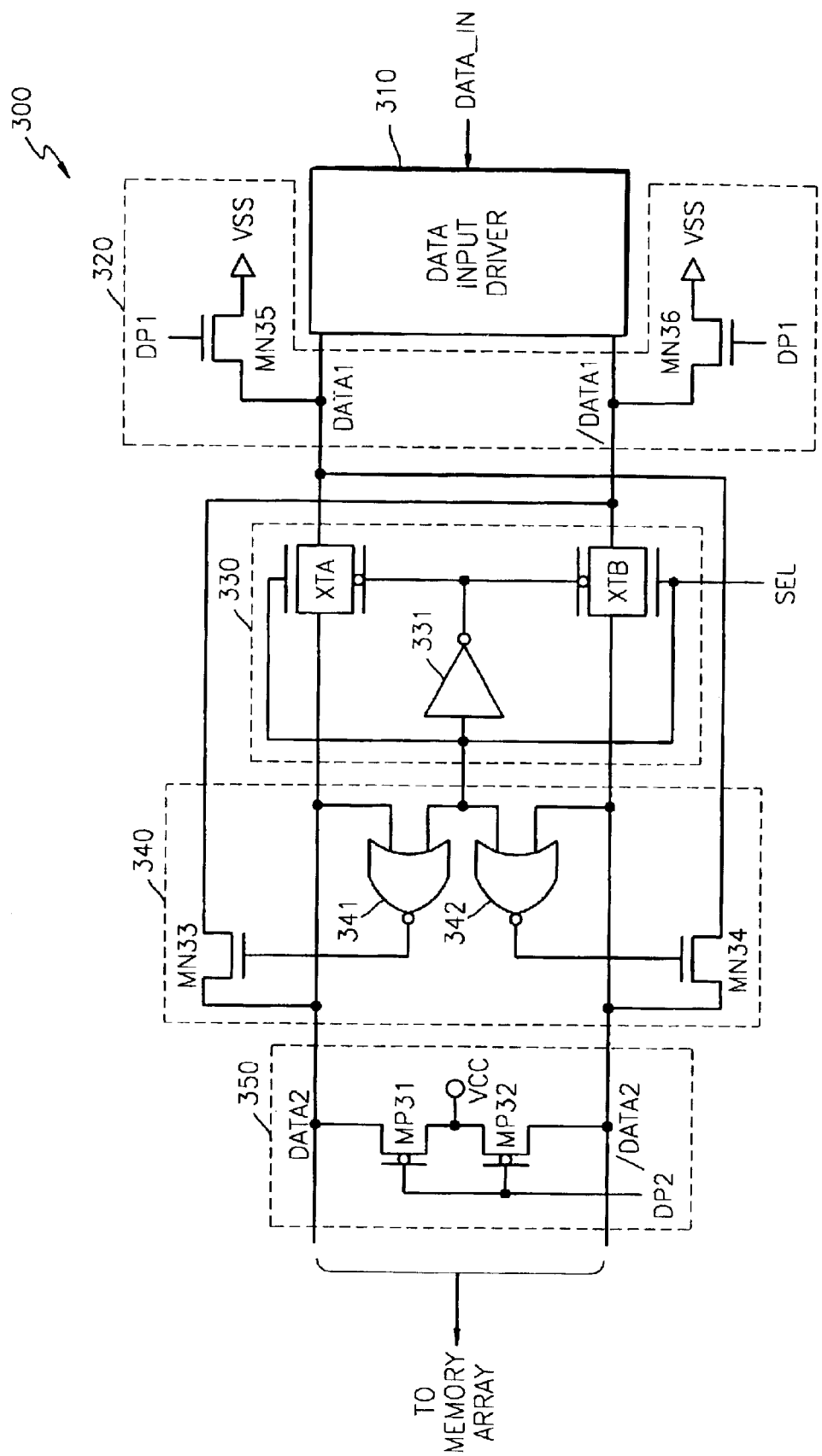
FIG. 3 is a semiconductor memory device having a precharge circuit according to an embodiment of the present invention.

Referring to FIG. 3, a semiconductor memory device includes a precharge circuit comprising a data input driver 310, a first precharge circuit 320, a switching circuit 330, a charge-sharing control circuit 340, and a second precharge circuit 350.

The data input driver 310 is connected to a first data line pair (DATA1, /DATA1) and drives input data (DATA_IN) to the first data line pair (DATA1, /DATA1).

The first precharge circuit 320, in response to a first control signal (DP1), precharges the first data line pair (DATA1, /DATA1) to a first voltage level (for example, ground (VSS) level). The first precharge circuit 320 can be implemented by NMOS transistors (MN35, MN36). The first control signal (DP1) is input to the gate of each NMOS transistor (MN35, MN36). The drain of the NMOS transistor (MN35) is connected to DATA1 of the first data line pair, while the drain of the NMOS transistor (MN36) is connected to /DATA1 of the first data line pair.

The switching circuit 330, in response to a selection signal (SEL), connects or disconnects the first data line pair (DATA1, /DATA1) and a second data line pair (DATA2, /DATA2). The switching circuit 330 can be implemented by two transmission gates (XTA, XTB) and one inverter 331.

The charge-sharing control circuit 340, in response to a selection signal (SEL), makes one line of the first data line pair (DATA1, /DATA1) and one line of the second data line pair (DATA2, /DATA2) share an electric charge.

The charge-sharing control circuit 340 comprises a first NOR gate 341, which receives the second data line (DATA2) signal and a selection signal (SEL) and outputs a first logic signal, and a second NOR gate 342, which receives the second data line (/DATA2) signal and a selection signal (SEL) and outputs a second logic signal. The charge-sharing control circuit 340 further comprises NMOS transistor (MN33) whose gate receives the first logic signal and whose source and drain are connected to the second data line (DATA2) and the first data line (/DATA1), respectively, and an NMOS transistor (MN34) whose gate receives the second logic signal and whose source and drain are connected to the second data line (/DATA2) and the first data line (DATA1), respectively.

The second precharge circuit 350 receives the second control signal (DP2) and precharges the second data line pair (DATA2, /DATA2) to a second voltage (for example, voltage supply (VCC) level, or a level obtained by subtracting a transistor threshold voltage (Vt) from the voltage supply (VCC)). The second precharge circuit 350 comprises PMOS transistors (MP31, MP32). The second control signal (DP2) is input to the gate of each PMOS transistor (MP31, MP32). The PMOS transistor (MP31) is connected between the second data line (DATA2) and VCC and the PMOS transistor (MP32) is connected between the complementary second data line (/DATA2) and VCC. The second precharge circuit 350, in response to an inactivated (for example, a "low" logic level) second control signal (DP2), precharges the second data line pair (DATA2, /DATA2) to voltage supply (VCC) level.

The semiconductor memory device 300 shown in FIG. 3 receives data through the data input driver 310, and the second data line pair (DATA2, /DATA2) are connected to a memory array (not shown) and the input data is stored in the memory array (not shown).

FIG. 4 is a table showing voltage levels in respective operations of the semiconductor memory device according to the circuit of FIG. 3.

In a precharge operation, the first data line pair (DATA1, /DATA1) and the second data line pair (DATA2, /DATA2) are precharged to a predetermined voltage level (for example, voltage supply (VCC) level, or a level obtained by subtracting a transistor threshold voltage (Vt) from the voltage supply (VCC), or a ground (VSS) level). During the precharge operation, the first control signal (DP1) is a "high" logic level and the second control signal (DP2) is a "low" logic level. The first precharge circuit 320, in response to the first control signal (DP1) that is transited to a "high" logic level, precharges the first data line pair (DATA1, /DATA1)

to a "low" logic level. If the first control signal (DP1) is transited to a "high" logic level, the NMOS transistors (MN35, MN36) are turned on such that the first data line pair (DATA1, /DATA1) is precharged to a "low" logic level. The second precharge circuit 350, in response to the second control signal (DP2) that is transited to a "low" logic level, precharges the second data line pair (DATA2, /DATA2) to a "high" logic level. If the second control signal (DP2) is transited to a "low" logic level, the PMOS transistors (MP31, MP32) are turned on such that the second data line pair (DATA2, /DATA2) is precharged to a "high" logic level. That is, in a precharge state, the first data line pair (DATA1, /DATA1) and the second data line pair (DATA2, /DATA2) are precharged to different voltage levels. At this time, the selection signal (SEL) is in a "low" logic level such that the switching circuit 330 does not connect the first data line pair (DATA1, /DATA1) with the second data line pair (DATA2, /DATA2).

During a write operation in a memory cell (not shown), data is received in the data input terminal (DATA_IN), and the data input driver 310 drives the first data line pair (DATA1, /DATA1). That is, in the first data line pair (DATA1, /DATA1), DATA1 is transited to a "high" logic level and /DATA1 is transited to a "low" logic level. This can be designed such that the first data line pair (DATA1, /DATA1), DATA1 is transited to a "low" logic level and /DATA1 is transited to a "high" logic level. An example in which DATA1 is transited to a "high" logic level and /DATA1 is transited to a "low" logic level will now be explained. In a write operation, the selection signal (SEL) is transited to a "high" logic level and the switching signal 330, in response to the selection signal (SEL), connects the first data line pair (DATA1, /DATA1) with the second data line pair (DATA2, /DATA2). The logic states of the second data line pair (DATA2, /DATA2) are transited in response to the first data line pair (DATA1, /DATA1). For convenience of explanation, it is assumed that DATA2 is transited to a "high" logic level and /DATA2 is transited to a "low" logic level. If a precharge operation begins after finishing the write operation, the selection signal (SEL) is transited to a "low" logic level and the transmission gates (XTA, XTB), in response to the selection signal (SEL), are disabled. The first NOR gate 341 of the charge-sharing control circuit 340 outputs a "low" logic level signal such that the transistor MN33 is turned off. The second NOR gate 342 outputs a "high" logic level signal such that the transistor MN34 is turned on and the charge of the first data line (DATA1) moves to the second data line (/DATA2). Accordingly, from the "low" logic level, the second data line (/DATA2) is precharged to a middle voltage level between the "low" logic level and the "high" logic level. From the "high" logic level, the first data line (DATA1) is precharged to the middle voltage level between the "low" logic level and the "high" logic level. The second selection signal (DP2) is transited to a "low" logic level and the first selection signal (DP1) is transited to a "high" logic level. Therefore, the first data line pair (DATA1, /DATA1) and the second line pair (DATA2, /DATA2) are precharged to a "high" logic level and a "low" logic level, respectively. The opposite logic states of the data line pair are shown in brackets in FIG. 4.

FIG. 5 is a graph showing the operation of data lines in a prior art semiconductor memory device, and FIG. 6 is a graph showing the operation of data lines in a semiconductor memory device according to the present invention.

As shown in FIG. 5, the operation of the data line in the prior art repeats the write operations and precharge operations and repetitive transition between voltage supply (Vcc or Vcc−Vt) corresponding to a "high" logic level and voltage supply corresponding to a "low" logic level consumes current.

However, as shown in FIG. 6, charge sharing by the first data line pair (DATA1, /DATA1) and the second data line pair (DATA2, /DATA2) between a write operation and a precharge operation, the operation of the data line in the present invention charges to a predetermined voltage supply level between a "high" logic voltage supply level and a "low" logic voltage supply level and precharges (60) such that current consumption can be reduced by an amount substantially equal to the charge-shared amount.

However, the present invention is not limited to the embodiments described above, and it is apparent that variations and modifications by those skilled in the art can be effected within the spirit and scope of the present invention defined in the appended claims. Therefore, the scope of the present invention is not determined by the above description but by the accompanying claims.

As described above, in a data write operation, the semiconductor memory device according to the present invention charges a data line of the second data line pair which should be charged to a "high" logic level, by using charge in a data line of the first data line pair which is charged to a "high" logic level such that the amount of current and power consumed in the data write operation can be reduced.

What is claimed is:

1. A semiconductor memory device comprising:
    a precharge circuit for precharging a first data line pair and a second data line pair to respective predetermined voltage levels in a precharge operation state, the first data line pair and the second data line pair each comprising a normal data line and a complementary data line;
    a data input driver for receiving data and driving the data to the first data line pair; and
    a control circuit, which in response to a selection signal, connects or disconnects the first data line pair with the second data line pair, and in response to the selection signal, connects or disconnects the normal data line of the first data line pair to the complementary data line of the second data line pair.

2. The semiconductor memory device of claim 1, wherein the precharge circuit comprises:
    a first precharge circuit, which in response to a first control signal, precharges the first data line pair to a first voltage level; and
    a second precharge circuit, which in response to a second control signal, precharges the second data line pair to a second voltage level.

3. The semiconductor memory device of claim 2, wherein the first voltage level is different from the second voltage level.

4. The semiconductor memory device of claim 1, wherein the control circuit controls, in response to the selection signal, the voltage level of the normal data line of the first data line pair and the voltage level of the complementary data line of the second data line pair to a predetermined voltage level between the first voltage level and the second voltage level.

5. The semiconductor memory device of claim 1, wherein the control circuit comprises:
    a first NOR gate for receiving the normal data line of the second data line pair and the selection signal and outputting a first logic signal;
    a second NOR gate for receiving the complementary data line of the second data line pair and the selection signal and outputting a second logic signal;

an NMOS transistor comprising a gate for receiving the first logic signal, a source coupled to the first line of the second data line pair and a drain coupled to the complementary data line of the first data line pair; and an NMOS transistor comprising a gate for receiving the second logic signal, a source coupled to the second line of the second data line pair and a drain coupled to the normal data line of the first data line pair.

6. A semiconductor memory device comprising:

a first precharge circuit for precharging a first data line pair to a first voltage level in a recharge operation state;

a second precharge circuit for precharging a second data line pair to a second voltage level in a precharge operation state;

a data input driver for receiving data and driving the data to the first data line pair;

a switch which in response to a selection signal, connects or disconnects the first data line pair with the second data line pair, the first data line pair and the second data line pair each comprising a normal data line and a complementary data line; and a charge-sharing control circuit, which in response to the selection signal, makes the normal data line of the first data line pair and the complementary data line of the second data line pair share charge.

7. The semiconductor memory device of claim 6, wherein the first voltage level is different from the second voltage level.

8. The semiconductor memory device of claim 6, wherein the charge-sharing control circuit controls, in response to the selection signal, the voltage level of the normal data line of the first data line pair and the voltage level of the complementary data line of the second data line pair to a predetermined voltage level between the first voltage level and the second voltage level.

9. The semiconductor memory device of claim 6, wherein the control circuit comprises:

a first NOR gate for receiving the normal data line of the second data line pair and the selection signal and outputting a first logic signal;

a second NOR gate for receiving the complementary data line of the second data line pair and the selection signal and outputting a second logic signal;

an NMOS transistor comprising a gate for receiving the first logic signal, a source coupled to the first line of the second data line pair and a drain coupled to the complementary data line of the first data line pair; and an NMOS transistor comprising a gate for receiving the second logic signal, a source coupled to the second line of the second data line pair and a drain coupled to the normal data line of the first data line pair.

10. A semiconductor memory device comprising:

a first data line pair comprising a normal data line and a complementary data line;

a second data line pair comprising a normal data line and a complementary data line;

a data input driver connected to the first data line pair, data input driver driving input data to the first data line pair; and a charge-sharing control circuit connected between the first data line pair and the second data line pair, and in a first step of a precharge operation, connects the normal data line of the first data line pair and the complementary data line of the second data line pair.

11. The semiconductor memory device of claim 10, wherein the first data line pair is precharged to a first voltage level in a second step of the precharge operation, the second data line pair is precharged to a second voltage level in the second step of the precharge operation, and the voltage level of the normal data line of the first data line pair and the complementary data line of the second data line pair that are connected to each other in the first step of the precharge operation is a predetermined voltage level between the first voltage level and the second voltage level.

12. The semiconductor memory device of claim 10, wherein the charge-sharing control circuit comprises:

a first NOR gate for receiving the normal data line of the second data line pair and the selection signal and outputting a first logic signal;

a second NOR gate for receiving the complementary data line of the second data line pair and the selection signal and outputting a second logic signal;

an NMOS transistor comprising a gate for receiving the first logic signal, a source coupled to the first line of the second data line pair and a drain coupled to the complementary data line of the first data line pair; and an NMOS transistor comprising a gate for receiving the second logic signal, a source coupled to the second line of the second data line pair and a drain coupled to the normal data line of the first data line pair.

* * * * *